United States Patent
Kondo

(10) Patent No.: US 11,255,919 B2
(45) Date of Patent: Feb. 22, 2022

(54) METHODS AND SYSTEM FOR A BATTERY

(71) Applicant: SEMICONDUCTOR COMPONENTS INDUSTRIES, LLC, Phoenix, AZ (US)

(72) Inventor: Hideo Kondo, Oizumi-Machi (JP)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 235 days.

(21) Appl. No.: 16/670,593

(22) Filed: Oct. 31, 2019

(65) Prior Publication Data

US 2021/0080508 A1  Mar. 18, 2021

Related U.S. Application Data

(60) Provisional application No. 62/899,262, filed on Sep. 12, 2019.

(51) Int. Cl.
| | |
|---|---|
| G01R 31/392 | (2019.01) |
| H02J 7/00 | (2006.01) |
| G01R 31/374 | (2019.01) |
| H01M 10/42 | (2006.01) |
| H01M 10/48 | (2006.01) |
| G01R 31/388 | (2019.01) |

(52) U.S. Cl.
CPC ......... *G01R 31/392* (2019.01); *G01R 31/374* (2019.01); *G01R 31/388* (2019.01); *H01M 10/4285* (2013.01); *H01M 10/486* (2013.01); *H02J 7/0047* (2013.01); *H02J 7/0048* (2020.01)

(58) Field of Classification Search
CPC .. G01R 31/392; G01R 31/388; G01R 31/374; H01M 10/4285; H01M 10/486; H02J 7/0047; H02J 7/0048
USPC .......................................................... 324/427
See application file for complete search history.

(56) References Cited

U.S. PATENT DOCUMENTS

| | | |
|---|---|---|
| 2013/0325303 A1 | 12/2013 | Kiuchi |
| 2014/0015488 A1 | 1/2014 | Despesse |
| 2014/0095092 A1 | 4/2014 | Ikeda |
| 2014/0269811 A1* | 9/2014 | Maleki ................ G01K 13/00 374/1 |
| 2014/0339891 A1 | 11/2014 | Ohkawa |
| 2016/0047861 A1 | 2/2016 | Chen |
| 2016/0052410 A1 | 2/2016 | Zhou |
| 2016/0052417 A1 | 2/2016 | Zhou |
| 2016/0052423 A1 | 2/2016 | Zhou |
| 2016/0052505 A1 | 2/2016 | Zhou |
| 2016/0318503 A1 | 11/2016 | Zhou |
| 2016/0336762 A1 | 11/2016 | Hunter |
| 2017/0045586 A1 | 2/2017 | Kiuchi |
| 2017/0170684 A1* | 6/2017 | Matthey .............. H02J 13/0003 |
| 2017/0214256 A1 | 7/2017 | Hardy |
| 2018/0086222 A1 | 3/2018 | Juang |
| 2018/0134170 A1 | 5/2018 | Zhou |
| 2018/0351381 A1* | 12/2018 | Shin .................... H02J 7/00047 |

* cited by examiner

*Primary Examiner* — Nathaniel R Pelton
(74) *Attorney, Agent, or Firm* — Dickinson Wright PLLC

(57) ABSTRACT

Various embodiments of the present technology may provide methods and system for a battery. The system may provide a fuel gauge circuit configured to estimate a state of health of the battery based on known battery data as a function of time, temperature, and remaining capacity.

18 Claims, 6 Drawing Sheets

METHODS AND SYSTEM FOR A BATTERY

CROSS-REFERENCE TO RELATED APPLICATIONS

This application claims the benefit of U.S. Provisional Patent Application No. 62/899,262, filed on Sep. 12, 2019, the entire contents of which is incorporated herein by reference.

BACKGROUND OF THE TECHNOLOGY

"Battery capacity" is a measure (typically in ampere-hours) of the charge stored by the battery and is determined by the mass of active material contained in the battery. The battery capacity represents the maximum amount of energy that can be extracted from the battery under certain specified conditions. The battery capacity can also be represented as a percentage and referred to as a relative state of charge (RSOC). The RSOC may be defined as a current battery capacity divided by a full charge capacity.

The effective storage capacity of the battery, however, diminishes with age and undergoes irreversible damage. This damage is caused by various mechanisms including corrosion and other chemical processes, and aging of the internal battery components contributes to the damage as well. Each charge/discharge cycle of the battery also has a similar effect but at an accelerated rate. Accordingly, battery deterioration may be the result of cycle aging, which occurs due to battery charge/discharge cycles, calendar aging, which occurs when the battery sits idle (e.g., during storage), and temperature. The end result is that as the battery ages and deteriorates, the effective capacity of the battery decreases (as illustrated in FIG. 1), reducing the amount of time the battery can supply power to a device.

One indicator of the battery's ability to retain charge and ability to power a device is the battery "state of health" (SOH), which may be estimated based on the effective capacity and parameters described above. Many applications use this parameter to estimate battery performance, for example the "run-time" (i.e., lifespan) of the battery, which reflects the amount of time the battery will continue to provide power before it dies. An accurate estimate of the run-time is desired to provide alerts to a user.

SUMMARY OF THE INVENTION

Various embodiments of the present technology may provide methods and system for a battery. The system may provide a fuel gauge circuit configured to estimate a state of health of the battery based on known battery data as a function of time, temperature, and remaining capacity.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

FIG. 1 representatively illustrates a usable and unusable portions of a battery as it ages;

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, memory devices, semiconductor devices, such as transistors and capacitors, and the like, which may carry out a variety of functions. In addition, the present technology may be integrated in any number of electronic systems, such as automotive, aviation, "smart devices," portables, and consumer electronics, and the systems described are merely exemplary applications for the technology.

Figure 1:
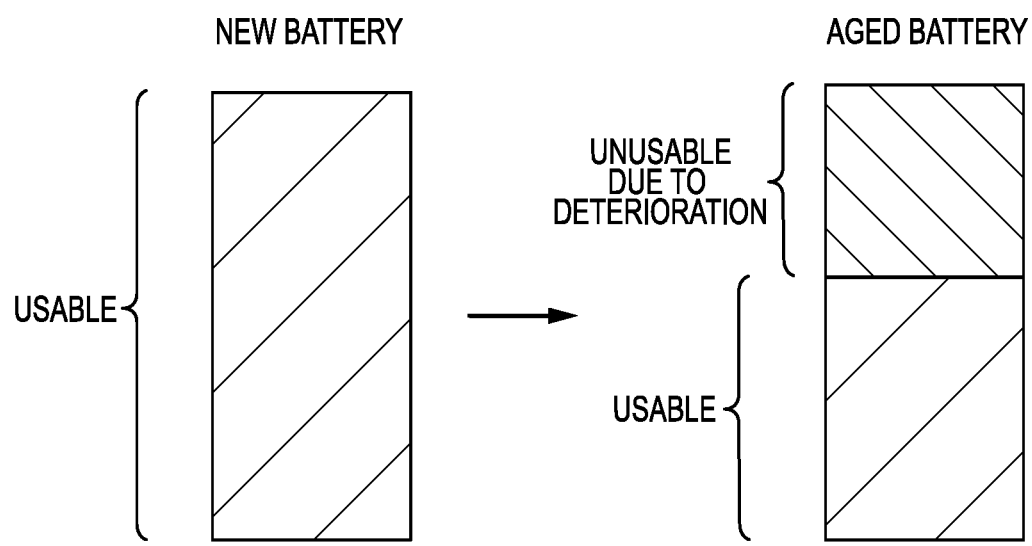
Figure 2:
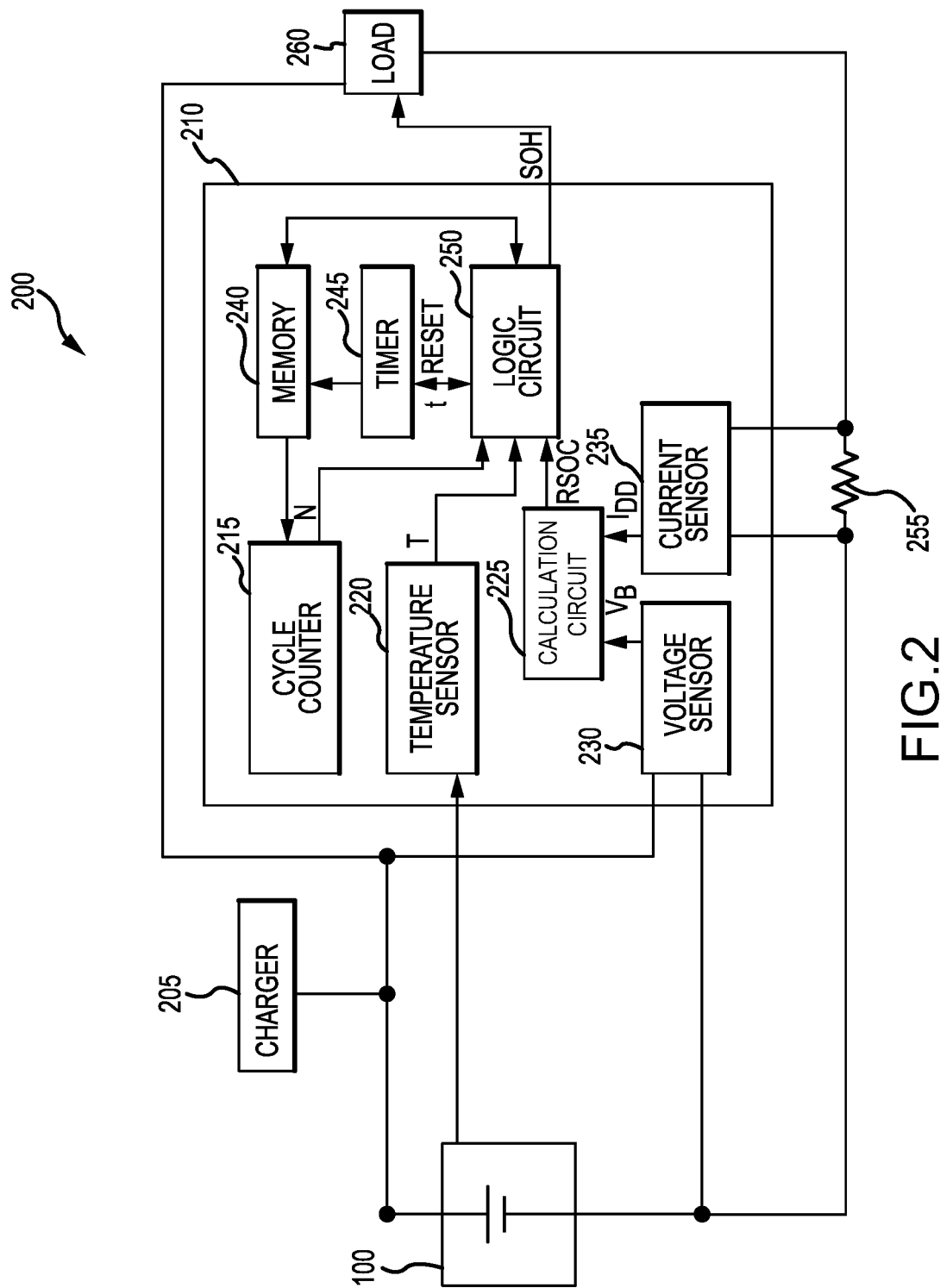
FIG. 2 is a block diagram of a battery system in accordance with an exemplary embodiment of the present technology.

Methods and apparatus for battery management according to various aspects of the present technology may operate in conjunction with any suitable electronic system and/or device, such as "smart devices," wearables, consumer electronics, portable devices, battery-powered vehicles, and the like. Referring to FIG. 2, an exemplary system 200 may be integrated in an electronic device (not shown), such as a camera, a cell phone, laptop computer, and the like, powered by a rechargeable battery 100, such as a lithium ion battery. For example, in various embodiments, the battery 100 may operate in conjunction with a charger 205 to provide power to a load 260.

The system 200 may further comprise a fuel gauge circuit 210 to manage various battery operations and monitor various battery conditions. For example, the fuel gauge circuit 210 may be configured to measure a voltage $V_B$ of the battery 100, measure a current $I_{DD}$ of the battery 100, compute a remaining capacity (also expressed as a percentage and referred to as the relative state of charge RSOC) of the battery 100, and estimate or compute a state of health (SOH) of the battery 100. The fuel gauge circuit 210 may be further configured to measure time and/or a number of charge/discharge cycles of the battery 100.

In addition, the fuel gauge circuit 210 may be configured to store various battery data. For example, the fuel gauge circuit 210 may store initial battery characteristics (which are characteristics of the battery when the battery is new), such as an initial full charge capacity ($FCC_{initial}$). The fuel gauge circuit 210 may also store known (i.e., predetermined) battery data, such as data relating to the capacity of the battery as it ages. For example, the fuel gauge circuit 210 may store battery capacity data as a function of time and battery capacity data as a function of cycle number. The battery capacity data as a function of time and the battery capacity data as a function of cycle number may be obtained by testing the battery 100 over a period of time (e.g., 40 months).

The fuel gauge circuit 210 may also store faded capacity data of the battery, wherein the faded capacity represents a decrease from the initial full charge capacity. For example, the fuel gauge circuit 210 may store faded capacity data as a function of temperature, faded capacity data as a function of time, and faded capacity data as a function of remaining capacity. The faded capacity data may be obtained by testing the battery 100 over a period of time.

In an exemplary embodiment, the fuel gauge circuit 210 may comprise a cycle counter circuit 215. The cycle counter circuit 215 measures or otherwise tracks an amount of charge/discharge of the battery 100 based on the current of the battery and computes a cycle count number N. For example, the cycle counter circuit 215 may track a total amount of the current supplied to the battery 100 during charging and a total amount of current leaving the battery during discharging. In an exemplary embodiment, the cycle count number N may be calculated according to the following equation: N=[total sum of current]/[the full charge capacity].

The cycle counter circuit 215 may be connected to the battery and may comprise a circuit using conventional coulomb counting techniques or any other circuit suitable for tracking current during charging and discharging of the battery 100.

In an exemplary embodiment, the fuel gauge circuit 210 may comprise a temperature sensor 220 to measure a temperature T of the battery 100. The temperature sensor 220 may comprise a thermistor (not shown) that generates a signal and an analog-to-digital converter (not shown) to convert the thermistor signal to a voltage, which corresponds to the temperature T of the battery 100. The temperature sensor 220 may, however, comprise any appropriate sensor or other device or system for generating a signal corresponding to the temperature of the battery 100.

In an exemplary embodiment, the fuel gauge circuit 210 may comprise a voltage sensor 230 to measure the voltage $V_B$ of the battery 100. The voltage sensor 230 may be connected to the battery 100 and may comprise any circuit and/or device suitable for measuring a voltage potential across the battery 100.

In an exemplary embodiment, the fuel gauge circuit 210 may comprise a current sensor 235 to measure the current $I_{DD}$ to/from the battery 100 and the load 260. The current sensor 235 may operate in conjunction with a sense resistor 255, wherein the current sensor 235 measures a change in voltage across the sense resistor 255 to determine the current $I_{DD}$.

In an exemplary embodiment, the fuel gauge circuit 210 may comprise a calculation circuit 225 to compute the remaining capacity RC (measured in ampere-hours) and/or the RSOC (the remaining capacity RC represented as a percentage). The calculation circuit 225 may be connected to the voltage sensor 230 to receive the measured voltage $V_B$ data. The calculation circuit 225 may also be connected to the current sensor 230 to receive the measured current $I_{DD}$ data. The calculation circuit 225 may be configured to compute the remaining capacity (or RSOC) according to the measured voltage $V_B$ and the measured current $I_{DD}$. The calculation circuit 225 may compute the remaining capacity of the battery 100 according to conventional "voltage-based" methods and techniques.

Figure 3:
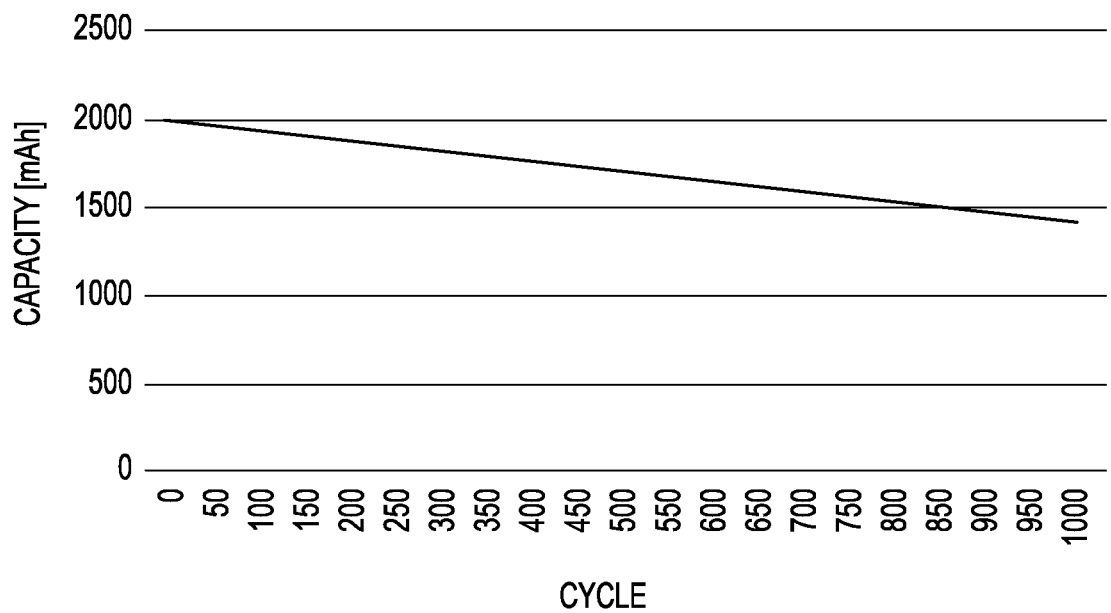
FIG. 3 is a graph illustrating a capacity of a battery as a function of cycle number in accordance with an exemplary embodiment of the present technology.
Figure 4:
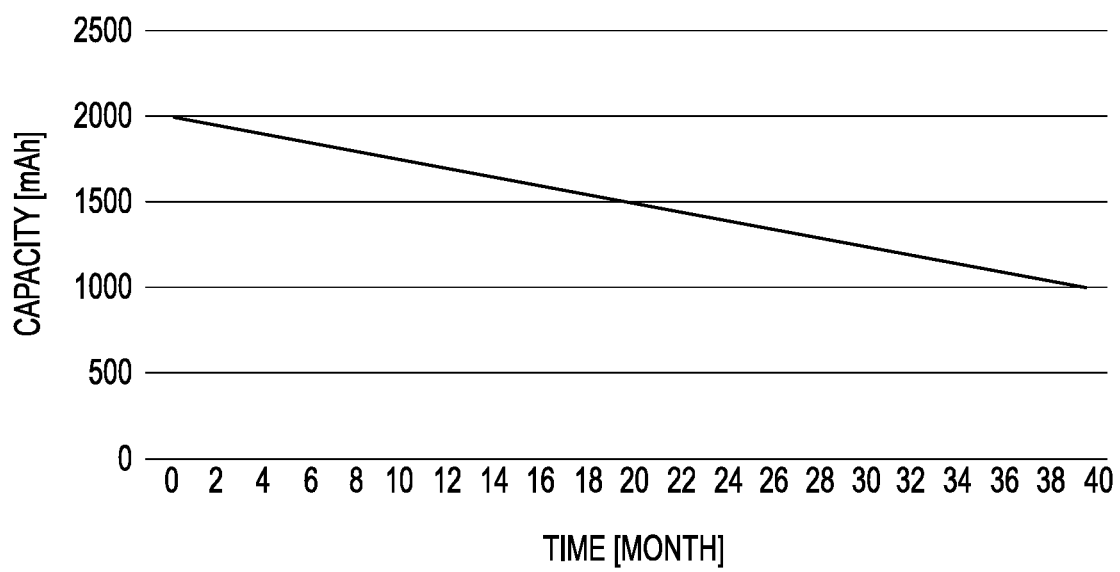
FIG. 4 is a graph illustrating a capacity of a battery as a function of time in accordance with an exemplary embodiment of the present technology.
Figure 5:
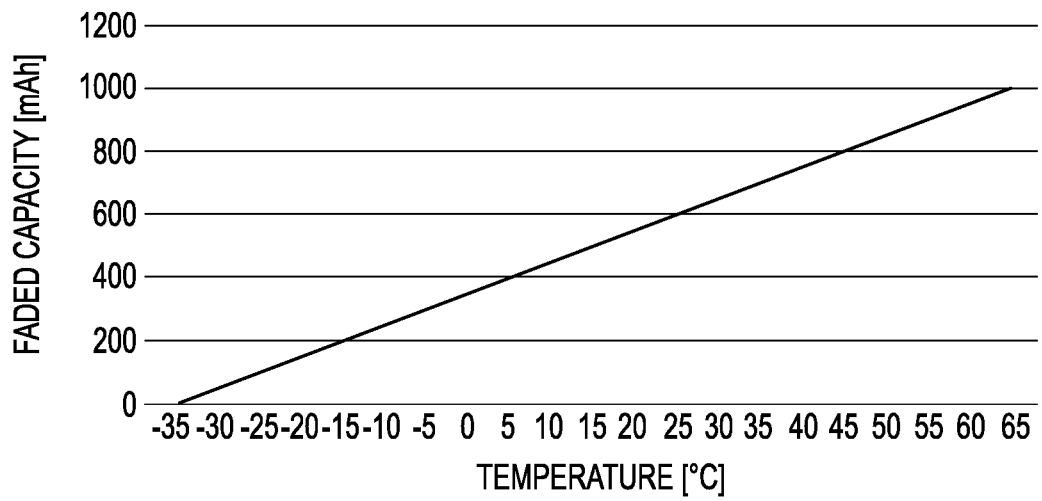
FIG. 5 is a graph illustrating a faded capacity of a battery as a function of temperature in accordance with an exemplary embodiment of the present technology.
Figure 6:
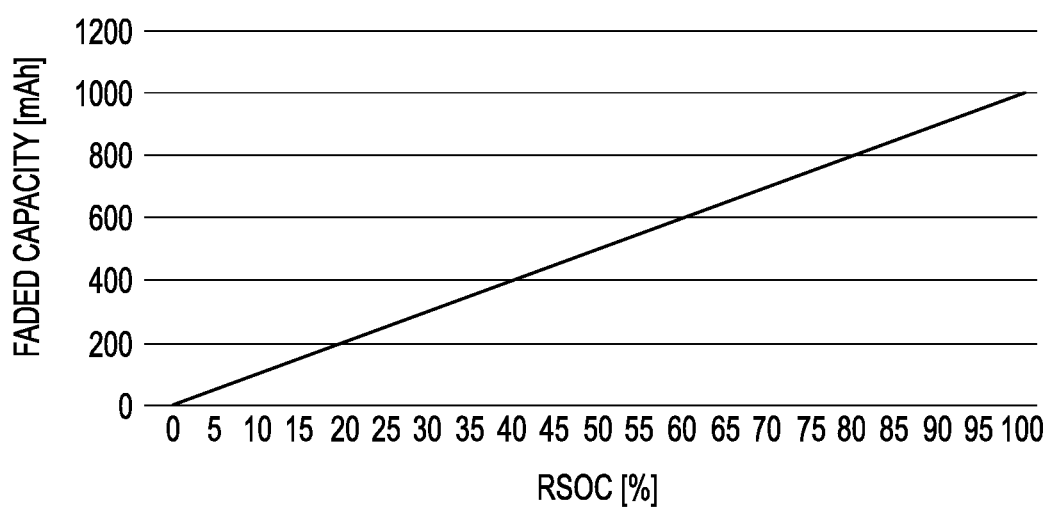
FIG. 6 is a graph illustrating a faded capacity of a battery as a function of RSOC in accordance with an exemplary embodiment of the present technology.
Figure 7:
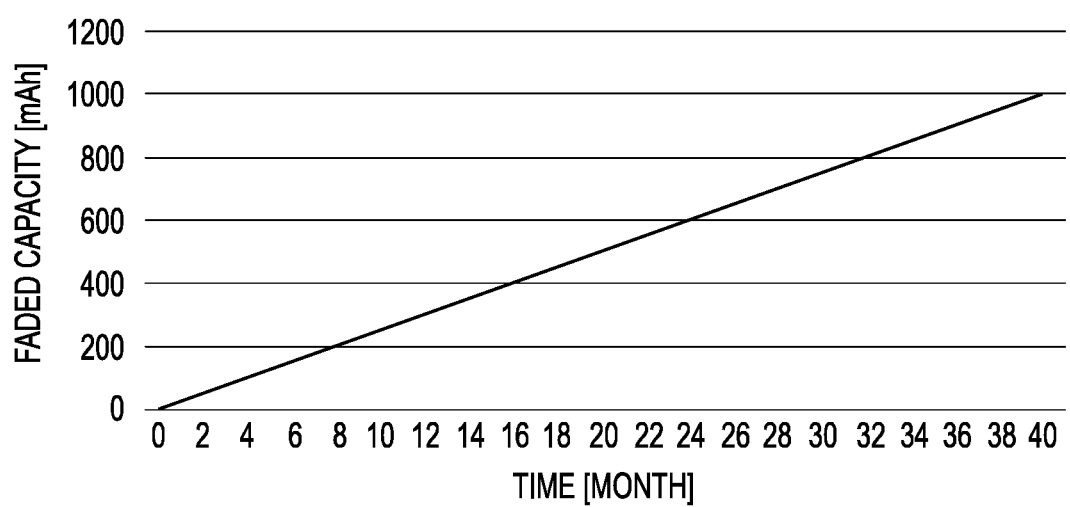
FIG. 7 is a graph illustrating a faded capacity of a battery as a function of time in accordance with an exemplary embodiment of the present technology.
Figure 8:
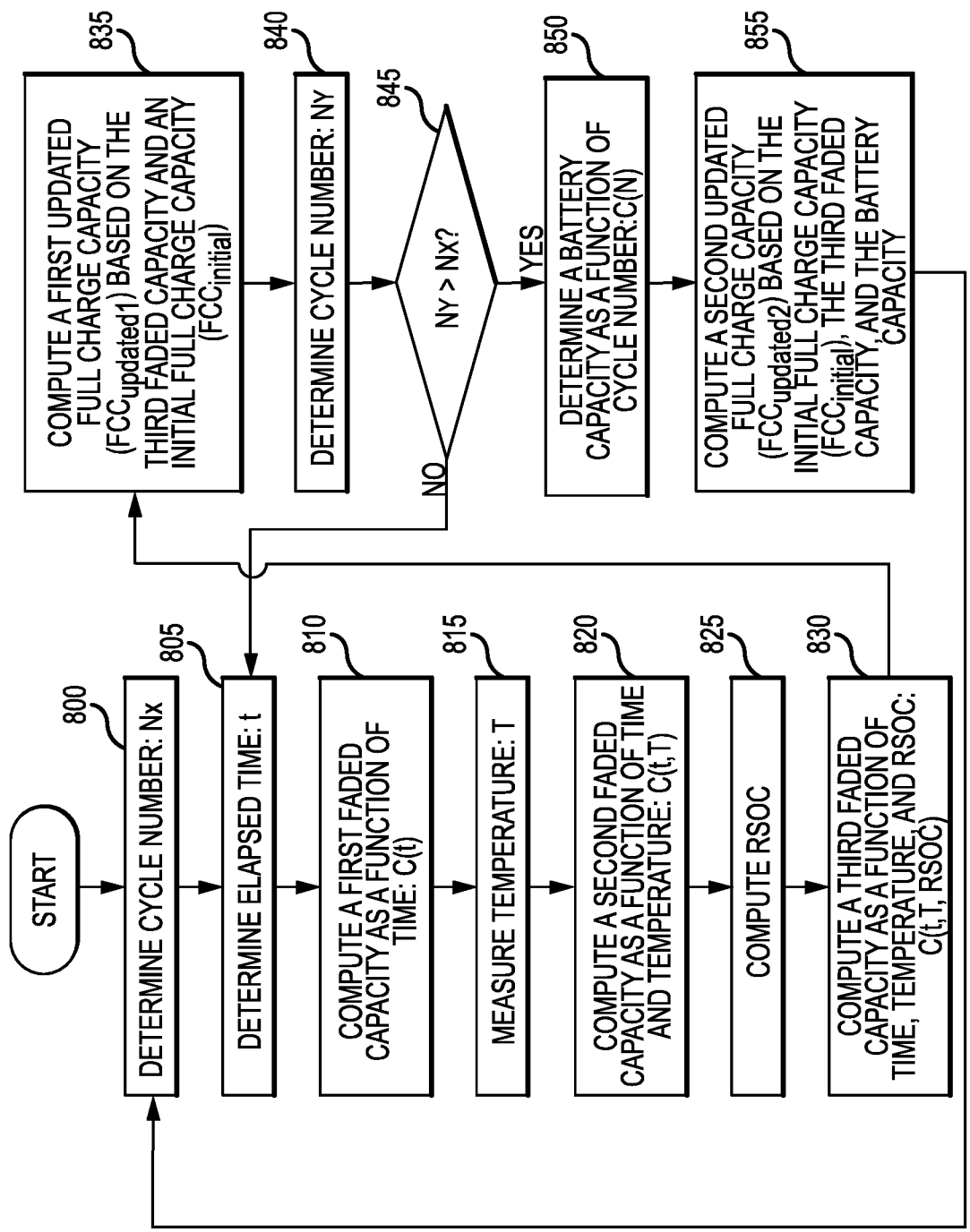
FIG. 8 is a flow chart for operating the battery system in accordance with an exemplary embodiment of the present technology.

In an exemplary embodiment, the fuel gauge circuit 210 may comprise a memory 240 to store the known battery characteristics and profile data of the battery, such as the initial full charge capacity $FCC_{initial}$, first profile data comprising the faded capacity as a function of time (e.g., as illustrated in FIG. 7), second profile data comprising the faded capacity data as a function of temperature (e.g., as illustrated in FIG. 5), third profile data comprising the faded capacity data as a function of remaining capacity (e.g., as illustrated in FIG. 6), the battery capacity data as a function of time (e.g., as illustrated in FIG. 4), and the battery capacity data as a function of cycle number (e.g., as illustrated in FIG. 3). The faded capacity as a function of temperature, the faded capacity data as a function of time, the faded capacity data as a function of remaining capacity, the battery capacity data as a function of time, and the battery capacity data as a function of cycle number may be stored in look-up tables (also referred to as profile tables) or any other storage suitable for storing a collection of related data values.

The memory 240 may also be configured to store various computed or measured variables, such as a computed SOH, updated full charge capacity values, elapsed time values, and the like.

The memory 240 may comprise any number of storage devices, such as registers, a flash memory device, EEPROM (electrically erasable programmable read-only memory), ROM (read only memory), and RAM (random access memory), and the like. The memory 240 may be configured to communicate with the cycle counter circuit 215. For example, data in the memory 240, such as the initial full charge capacity $FCC_{initial}$, may be accessible to the cycle counter circuit 215.

In an exemplary embodiment, the fuel gauge circuit 210 may comprise a timer 245 to measure or otherwise track an amount of elapsed time t from a starting time $t_0$. The timer 245 may comprise any circuit and/or device suitable for measuring an amount of time elapsed from a starting time.

In an exemplary embodiment, the fuel gauge circuit 210 may comprise a logic circuit 250 to perform various computations and/or estimate the state of health of the battery 100 according to measured parameters and/or known parameters, such as the remaining capacity, the initial full charge capacity $FCC_{initial}$, and an updated full charge capacity $FCC_{updated}$. The logic circuit 250 may be configured to receive the computed remaining capacity (or RSOC) from the calculation circuit 225, the temperature T from the temperature sensor 220, the cycle count value N from the cycle counter circuit 215. The logic circuit 250 may also be configured to access various data from the memory 240. In addition, the logic circuit 250 may be configured to communicate with the timer 245. For example, the logic circuit 250 may be configured to reset the timer 245 and/or receive the elapsed time value t.

The logic circuit 250 may be configured to compute a number of fade ratios based on the known profile data and/or other measured parameters, such as time, temperature, and remaining capacity (or RSOC). In an exemplary embodiment, the logic circuit 250 may be configured to compute a first fade ratio $F_1$ according to the following equation: $F_1 = A^*((t_P - t_C)/B)$ (Equation 1), where A is a total amount of reduced capacity over a test period, B is the length of the test period measured in seconds, $t_P$ is a previous time measured in seconds, and $t_C$ is a current time measured in seconds. For example, if the battery 100 was tested for 40 months (B=40 months=105148800 seconds) and it is observed that at the end of the 40 months, the battery capacity was reduced from 2000 mAh to 1000 mAh, then A would be 0.5.

The logic circuit 250 may be configured to compute a second fade ratio $F_2$ according to the following equation: $F_2=A*((T+35)/R)$ (Equation 2), where T is the temperature measured in degree Celsius, R is a maximum temperature difference (for example, and referring to FIG. 5, if 65 is the highest temperature value and −35 is the lowest temperature value, then R=65−(−35)=100), and A is the total amount of reduced capacity over the test period.

Referring to FIGS. 2 and 6, the logic circuit 250 may be configured to compute a third fade ratio $F_3$ according to the following equation: $F_3=A*RSOC/100$ (Equation 3), where the RSOC is the computed relative state of charge and A is the total amount of reduced capacity over the test period.

In various embodiments, the logic circuit 250 may be further configured to estimate or otherwise compute the SOH of the battery 100 according to the following equation: $SOH=FCC_{updatedN}/FCC_{initial}$ (Equation 4), where $FCC_{updatedN}$ is a computed full charge capacity value after some period of time has passed, and is typically less than the initial full charge capacity value $FCC_{initial}$. The logic circuit 250 may transmit the computed SOH to the load 260 and/or the memory 240.

The logic circuit 250 may comprise any number of circuits, systems, and/or logic gates to perform the desired computations, as described above. For example, the logic circuit 250 may comprise a field programmable gate array, logic gates, an application specific integrated circuit, and the like.

In operation, and referring to FIGS. 2-8, the fuel gauge circuit 210 may perform various measurements of the battery 100 and perform various computations to estimate the state of health of the battery 100, and thereby estimate the lifespan of the battery 100.

In an exemplary embodiment, the fuel gauge circuit 210 may determine the cycle number Nx (800), for example using the cycle counter 215, as described above, and determine the elapsed time t (805), for example using the timer 245. The fuel gauge circuit 210 may then compute a first faded capacity as function of time C(t) (810), for example, using the elapsed time t, the initial full charge capacity $FCC_{initial}$, and the first fade ratio $F_1$ (equation 1, above). In an exemplary embodiment, the first faded capacity may be computed according to the following equation: $C(t)=F_1*t*FCC_{initial}$.

The fuel gauge circuit 210 may then measure the temperature T (815) and compute a second faded capacity as a function of the time t and the temperature T (i.e., C(t,T)) (820), for example using the first faded capacity C(t) and the second fade ratio $F_2$ (equation 2, above). In an exemplary embodiment, the second faded capacity may be computed according to the following equation: $C(t,T)=C(t)*F_2$.

The fuel gauge circuit 210 may then compute the RSOC (825), for example, using the calculation circuit 225, and compute a third faded capacity as a function of the time t, the temperature T, and the RSOC (i.e., C(t, T, RSOC)) (830), for example, using the second faded capacity C(t, T) and the third fade ratio $F_3$ (equation 3, above). In an exemplary embodiment, the third faded capacity may be computed according to the following equation: $C(t,T, RSOC)=C(t, T)*F_3$.

The fuel gauge circuit 210 may then compute a first updated full charge capacity ($FCC_{updated1}$) based on third faded capacity C(t, T, RSOC) and the initial full charge capacity ($FCC_{initial}$) (835). The fuel gauge circuit 210 may then store the first updated full charge capacity to the memory 240. The first updated full charge capacity ($FCC_{updated1}$) may replace the initial full charge capacity value $FCC_{initial}$ for the purpose of computing future battery capacities or other computations using a full charge capacity value.

In various embodiments, the fuel gauge circuit 210 may also determine a new cycle number $N_Y$ (840) and determine if the new cycle number $N_Y$ is greater than the previously-recorded cycle number Nx (845). If the new cycle number $N_Y$ is not greater than the previously-recorded cycle number Nx, then the fuel gauge circuit 210 checks the elapsed time t again (805). If the new cycle number $N_Y$ is greater than the previously-recorded cycle number Nx, then the fuel gauge circuit 210 may determine a battery capacity as a function of the cycle number (i.e., $C(N_Y)$) (850) and compute a second updated full charge capacity ($FCC_{updated2}$) based on the initial full charge capacity ($FCC_{initial}$), the third faded capacity (C(t, T, RSOC)), and the battery capacity ($C(N_Y)$). The fuel gauge circuit 210 may then store the second updated full charge capacity ($FCC_{updated2}$) to the memory 240. The second updated full charge capacity ($FCC_{updated2}$) may replace the initial full charge capacity $FCC_{initial}$ and/or the first updated full charge capacity value $FCC_{updated1}$ for the purpose of computing future battery capacities or other computations using a full charge capacity value.

In various embodiments, the fuel gauge circuit 210 may also estimate or otherwise compute the state of health of the battery, as described above in equation 4. The fuel gauge circuit 210 may transmit the computed SOH to the memory 240 and/or the load 260.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for monitoring a battery, comprising:
   a timer configured to measure an elapsed time from a starting time;
   a measurement circuit configured to compute a remaining capacity of the battery;
   a temperature sensor configured to measure a temperature of the battery;
   a memory configured to store:
      an initial full charge capacity value of the battery; and
      known data of faded capacity values of the battery as a function of time, temperature, and remaining capacity; and
   a logic circuit configured to:
      compute an updated full charge capacity value based on:
         the initial full charge capacity value;
         the measured elapsed time;
         the computed remaining capacity;
         the measured temperature; and
         the known capacity values;
      compute the state of health of the battery, wherein the state of health of the battery is defined by a ratio of the updated full charge capacity value and the initial full charge capacity value; and
      transmit the computed state of health to the memory.

2. The apparatus according to claim 1, wherein the initial full charge capacity value is a capacity of the battery at the starting time.

3. The apparatus according to claim 1, wherein the known data comprises a first profile table comprising faded capacity values as a function of time.

4. The apparatus according to claim 3, wherein the logic circuit is further configured to determine a first fade ratio based on the first profile table.

5. The apparatus according to claim 1, wherein the known data comprises a second profile table comprising faded capacity values as a function of temperature.

6. The apparatus according to claim 5, wherein the logic circuit is further configured to determine a second fade ratio based on the second profile table.

7. The apparatus according to claim 1, wherein the known data comprises a third profile table comprising faded capacity values as a function of remaining capacity.

8. The apparatus according to claim 7, wherein the logic circuit is further configured to determine a third fade ratio based on the first profile table.

9. The apparatus according to claim 1, further comprising a cycle counter, wherein the cycle counter counts a number of charge/discharge cycles of the battery.

10. The apparatus according to claim 1, wherein the memory further comprises faded capacity values as a function of charge/discharge cycles.

11. A method for monitoring a battery, comprising:
    measuring an elapsed time from a starting time;
    computing a remaining capacity of the battery;
    measuring a temperature of the battery; and
    computing an updated full charge capacity value based on:
       an initial full charge capacity value, wherein the initial full charge capacity value is a capacity of the battery at the starting time;
       a first fade ratio, wherein the first fade ratio is a function of the measured elapsed time;
       a second fade ratio, wherein the second fade ratio is a function of the measured temperature; and
       a third fade ratio, wherein the third fade ratio is a function of the computed remaining capacity; and
    estimating a state of health of the battery based on the updated full charge capacity value.

12. The method according to claim 11, further comprising counting a number of charge/discharge cycles of the battery.

13. The method according to claim 12, wherein computing the updated full charge capacity value is also based on the number of counted charge/discharge cycles of the battery.

14. A system, comprising:
    a battery;
    a temperature sensor to detect a temperature of the battery; and
    a fuel gauge circuit connected to the battery and the temperature sensor, and configured to:
       measure an elapsed time from a starting time;
       compute a remaining capacity of the battery at the elapsed time;
       measure a temperature of the battery at the elapsed time;
       compute an updated full charge capacity (UFCC) value at the elapsed time based on:
          known data of faded capacity values of the battery as a function of time, temperature, and remaining capacity;
          an initial full charge capacity (IFCC) value, wherein the IFCC value is a capacity of the battery at the starting time;
          the measured elapsed time;
          the computed remaining capacity; and
          the measured temperature of the battery at the elapsed time; and
       estimate a state of health of the battery based on the computed UFCC value.

15. The system according to claim 14, wherein the known data comprises:
    a first profile table comprising the faded capacity values as a function of time;

a second profile table comprising the faded capacity values as a function of temperature; and a third profile table comprising the faded capacity values as a function of remaining capacity.

16. The system according to claim 15, wherein the fuel gauge is further configured to determine:

a first fade ratio based on the first profile table;

a second fade ratio based on the second profile table; and a third fade ratio based on the third profile table.

17. The system according to claim 14, wherein the fuel gauge is further configured to count a number of charge/discharge cycles of the battery.

18. The system according to claim 17, wherein the UFCC value is also based on known data of faded capacity values as a function of the number of counted charge/discharge cycles.

* * * * *